United States Patent [19]

Neukermans

[11] Patent Number: 5,658,710
[45] Date of Patent: Aug. 19, 1997

[54] METHOD OF MAKING SUPERHARD MECHANICAL MICROSTRUCTURES

[75] Inventor: Armand P. Neukermans, Palo Alto, Calif.

[73] Assignee: Adagio Associates, Inc., Palo Alto, Calif.

[21] Appl. No.: 395,410

[22] Filed: Feb. 24, 1995

Related U.S. Application Data

[63] Continuation-in-part of Ser. No. 92,780, Jul. 16, 1993, Pat. No. 5,393,647.
[51] Int. Cl.⁶ .................................................. C23C 26/00
[52] U.S. Cl. .......................... 430/320; 216/2; 216/11; 427/249; 427/255
[58] Field of Search ........................ 437/242, 244; 216/2, 11; 430/320; 427/249, 255

[56] References Cited

U.S. PATENT DOCUMENTS

| | | | |
|---|---|---|---|
| 4,123,571 | 10/1978 | Balog et al. | 427/249 |
| 4,968,585 | 11/1990 | Albrecht et al. | 430/320 |
| 4,968,641 | 11/1990 | Kalnitsky et al. | 437/69 |
| 5,032,545 | 7/1991 | Doan et al. | 437/242 |
| 5,179,499 | 1/1993 | MacDonald et al. | 361/313 |
| 5,201,992 | 4/1993 | Marcus et al. | 156/643 |
| 5,332,697 | 7/1994 | Smith et al. | 437/242 |

OTHER PUBLICATIONS

Gary Stix, "Micron Machinations", Scientific American, Nov. 1992 pp. 106–117.
J. Graul and E. Wagner, "Growth mechanism of polycrystalline β–SiC layers on silicon substrate", Applied Physics Letters 56, vol. 21, No. 2, pp. 67 (1972).
C.J. Mogab and H.J. Leamy, "Conversion of Si to epitaxial SiC by reaction with $C_2H_2$", Applied Physics Letters, vol. 45, No. 3, p. 1075 (1974).
J. Liu et al., "Modification of Si field emitter surfaces by chemical conversion to SiC", J.Vac.Sci.Technol.B, vol. 12, No. 2 Mar./Apr. 1994.
R. B. Marcus et al., "Formation of silicon tips with < 1 nm radius", *Appl. Phys. Lett.*, vol. 56, No. 3, pp. 236–238 (15 Jan. 1990).

*Primary Examiner*—John A. McPherson
*Attorney, Agent, or Firm*—Donald E. Schreiber

[57] ABSTRACT

The forming of superhard, durable and inert mechanical microstructures, such as tips for atomic force microscopy and field emission, membranes, hinges, actuators, and sensors requires micromachining of silicon or polysilicon. The microstructures are then reacted with a hydrocarbon or ammonia gas, at a temperature in the range of 700° C. to 1100° C. and in partial vacuum conditions for several minutes. Gases such as methane, ethane, or acetylene will convert the surface layers to SiC, which is useful for its conductive properties, while ammonia gas will convert the surface layers to $Si_3N_4$, which is useful for its insulative properties. Thus, the converted material will have improved physical, mechanical, chemical and electrical properties.

18 Claims, 4 Drawing Sheets

METHOD OF MAKING SUPERHARD MECHANICAL MICROSTRUCTURES

CROSS-REFERENCE TO RELATED APPLICATION

This application is a continuation-in-part of U.S. patent application Ser. No. 08/092,780, filed Jul. 16, 1993, now U.S. Pat. No. 5,393,647, granted Feb. 28, 1995.

TECHNICAL FIELD

The invention relates to microminiature mechanical structures such as hinges, cantilevers, actuators, sensors, diaphragms, and membranes.

BACKGROUND ART

Mechanical microstructures (MEMS) is a general term used to describe very small devices such as gears and levers, which may be combined to create complex, yet tiny machines. Such microstructures need not be limited to mechanical tools. For example, a tiny membrane can be employed as a sensor of differential gas pressures by measuring a capacitance between that membrane and an adjacent surface. Similarly, tiny cantilevers can be actuated via an applied electrical force to control valves for fluid flow. Other known microstructures include sharply pointed tips for microprobes used in atomic force microscopy or for field emitting structures.

As noted in an article by Gary Stix entitled, "Micron Machinations," *Scientific American*, November 1992, pp. 106–117, MEMS can differ from larger, more commonplace machines in structure, method of formation and method of use. Typically MEMS are fabricated with technologies developed for semiconductor processing, such as etching of silicon, because tools that are used for production of larger machines do not allow for the fine micromachining necessary to create MEMS. MEMS created from silicon or polysilicon substrates have characteristics derived from those materials. The substrates are hard, though brittle, and can be micromachined to create structures with submicron features. However, silicon and polysilicon are also fairly reactive, and if left exposed to air quickly form a silicon monoxide or dioxide surface layer which is weaker than the starting materials and which continues to grow into the substrate.

It is an object of the present invention to provide a method for making mechanical microstructures or portions thereof that are inert, durable, and harder than silicon and polysilicon.

DISCLOSURE OF THE INVENTION

The above object is achieved by forming a superhard and inert surface layer or skin on a silicon or polysilicon microstructure. Such a layer may be as thin as a mono-molecular layer and as thick as the entire microstructure. Since mechanical failures of microstructures commonly begin at the surface and propagate through or along the structure, having a superhard skin increases the strength of the entire structure. Providing an inert skin to a microstructure prevents a gradual erosion of the structure due to oxidation of the surface layer. This procedure is similar to the surface hardening of steel for larger structures.

The hard and inert surface layer of the present invention is formed by first forming a micromechanical structure in silicon or polysilicon by conventional semiconductor processes such as photolithography and etching. The resulting microstructure, or array of microstructures on a wafer, is then reacted at an elevated temperature with a hydrocarbon or ammonia gas so that carbon or nitrogen atoms from the gas diffuse into a surface layer of the structure., forming a silicon carbide or silicon nitride compound, respectively, in the surface layer.

Conversion of the surface layer in a gaseous ambient is different than coating the surface with a layer of carbide or nitride. The layering processes of the prior art yielded more rounded edges, tips and corners. To retain the shape of the micromachined structure, which can involve very sharp corners and tips, the infusion of carbon or nitrogen into the surface layer of silicon or polysilicon takes place at temperatures appreciably below the melting point of silicon and polysilicon and below a temperature at which these materials become soft. It is important to remove any native oxides that have formed on the surface of the microstructure prior to converting the surface layer to silicon carbide or silicon nitride. This stripping of native oxides can be accomplished by dipping in a 10:1 solution of DI water and hydrofluoric acid, or by exposing the structure to hydrogen gas at temperatures of 700° C. to 950° C.

Either the whole or a part of a microstructure may be converted into derivatives of Si having superior hardness properties. Another advantage of SiC surface layers for MEMs is that the surface layers are sufficiently conductive to bleed off charge acquired by friction, are much more inert, and less likely to collect moisture. These properties decrease the sticking (less stiction) usually observed in microstructures. Thus, conversion changes physical, electrical and chemical properties of the base material.

BEST MODE FOR CARRYING OUT THE INVENTION

Figure 1:
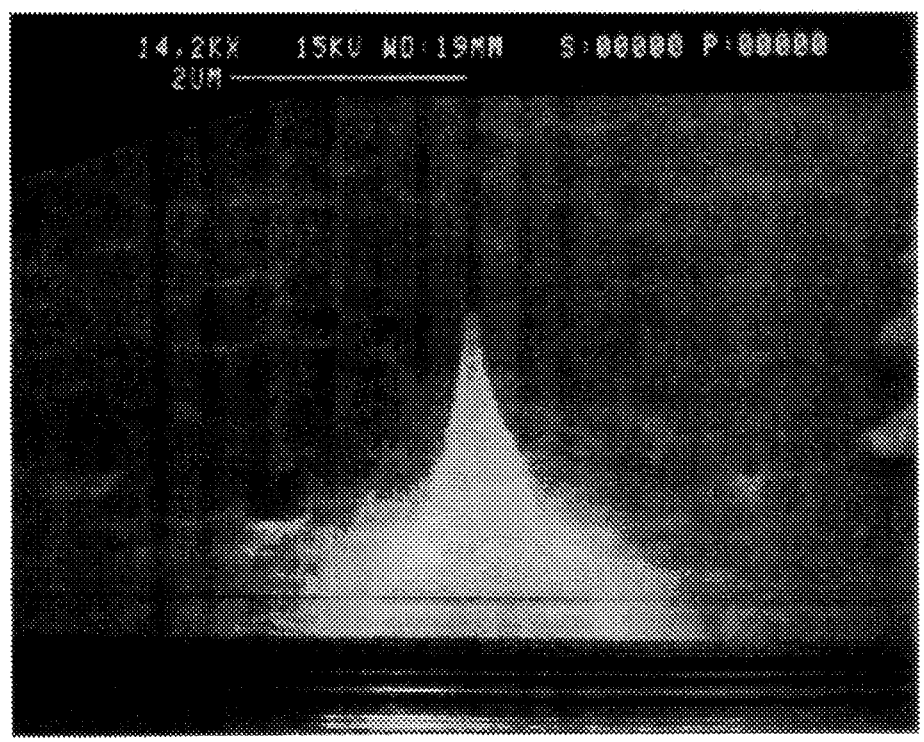
FIGS. 1 and 2 are scanning electron microscopy pictures of a micro-probe tip made in accord with the present invention.

A silicon tip on a silicon cantilever substrate such as may be employed in atomic force microscopy (AFM) is first made in a conventional process, for example as described in U.S. Pat. No. 4,968,585 to the point of forming silicon posts with any cap removed. This process involves use of semiconductor masking and etching techniques. A desired cantilever section is laid out on a solid silicon wafer with an integral tip section. Silicon is etched away in the cantilever section leaving a post at the tip section. The post is then sharpened using the technique described by Marcus et al. in Applied Physics Letters 56, no. 3, p. 226 (1990) until a high aspect ratio tip is formed. A high aspect ratio is commonly defined as the length of the tip exceeding the dimension of the base by at least five times. The technique of Marcus et al. involves repeated oxidation and removal of oxide. However, the present invention is not limited to this method, and may be used with any process that produces a tip, with a shape roughly suited to AFM before final shaping. Final shaping may be by any suitable method such as ion beam etching of silicon or polysilicon, reactive ion or plasma etching or various wet etch processes, including electrochemical processes.

When the formation of the tip is finished, the tip, which is free from oxide at this point, is placed in a reactive environment, generally at a pressure of $10^{-7}$ to $5 \times 10^{-2}$ Torr and at a temperature in a range of 700° C. to 1100° C., but preferably in the 700° C. to 950° C. range. The surface of the silicon or polysilicon, or other base material is converted into the material of choice. The exact temperature employed involves a tradeoff between the thickness of the converted layer and the sharpness of the tip. Sharper tips are maintained at lower reaction temperatures. As the tip is very thin it is possible to convert the critical parts of the tip completely, if so desired, while coating the rest of it with a layer of the reactant material. The conversion process is not dependent on the shaping process which is used. For the situation in which the surface layer to be converted has been exposed to air, it is important to remove any native oxides which have formed on the surface.

Instead of forming a tip on a cantilever for AFM as described above, an array of such tips can be formed on a surface for field emission from the tips. In this situation, an array of silicon tips may be formed as described in U.S. Pat. No. 5,201,992 to Marcus et al. After formation of the tips as described therein, the tips are exposed to a hydrocarbon gas such as methane, ethane, or propane at an elevated temperature preferably in the range of 700° C. to 950° C., at an atmosphere of $10^{-7}$ to $5 \times 10^{-2}$ Torr for one to twenty minutes, as described above. The carbon atoms from the hydrocarbon gas diffuse into the surface layer of the tips to form a silicon carbide surface layer, leaving the shape of the tips essentially unchanged. Such electrically conductive tips have an advantage when used in field emission due to their sharpness, which promotes electron emission, and their hardness, which minimizes damage from impacting ions, thereby extending their life.

Numerous examples in the literature describe the conversion of a Si surface to a SiC surface, when the Si surface is exposed at high temperature to hydrocarbon compounds. This can be done at atmospheric pressure, or preferably at reduced pressure.

The method of J. Graul and E. Wagner, described in Applied Physics Letters, 21, no. 2, p. 67 (1972) relates to conversion of monocrystalline silicon to polycrystalline β-silicon carbide using methane. In this method, Si posts are placed on a pedestal inside of an evacuated reactor. The pedestal is inductively or otherwise heated to about 1200° C. Using hydrogen as a carrier gas, methane is introduced into the reactor under vacuum conditions in a flow through system. Some of the methane decomposes and SiC forms at the tips. SiC film thickens inwardly as more silicon is converted if the process is continued beyond a few minutes. Because only a layer 100 Å deep needs to be converted, conversion times of a few minutes, i.e. in the range of 1 to 20 minutes, are typical.

SiC tips can also be formed using acetylene or almost any aliphatic gaseous compound, rather than methane or ethane, as the organic reactive gas. The method of C. J. Mogab and H. J. Leamy, described in Applied Physics Letters, 45, no. 3, p. 1075 (1974) relates to conversion of monocrystalline silicon to β-silicon carbide using acetylene in a vacuum of $10^{-7}$ to $5 \times 10^{-4}$ Torr at temperatures between 800° and 1100° C.

Figure 2:

FIGS. 1 and 2 show a SiC tip made in accord with the present invention using the procedure of Mogab et al., except using propane $C_3H_8$, as the organic reactive gas. FIG. 1 shows a thinned tip before reacting with the gas. FIG. 2 shows the same tip after the reacting step. The tip has sides that arch upwardly following a curve that appears exponentially steep at the center. The height of the tip is more than 5 micrometers and the base dimension is about one micrometer.

Figure 3:
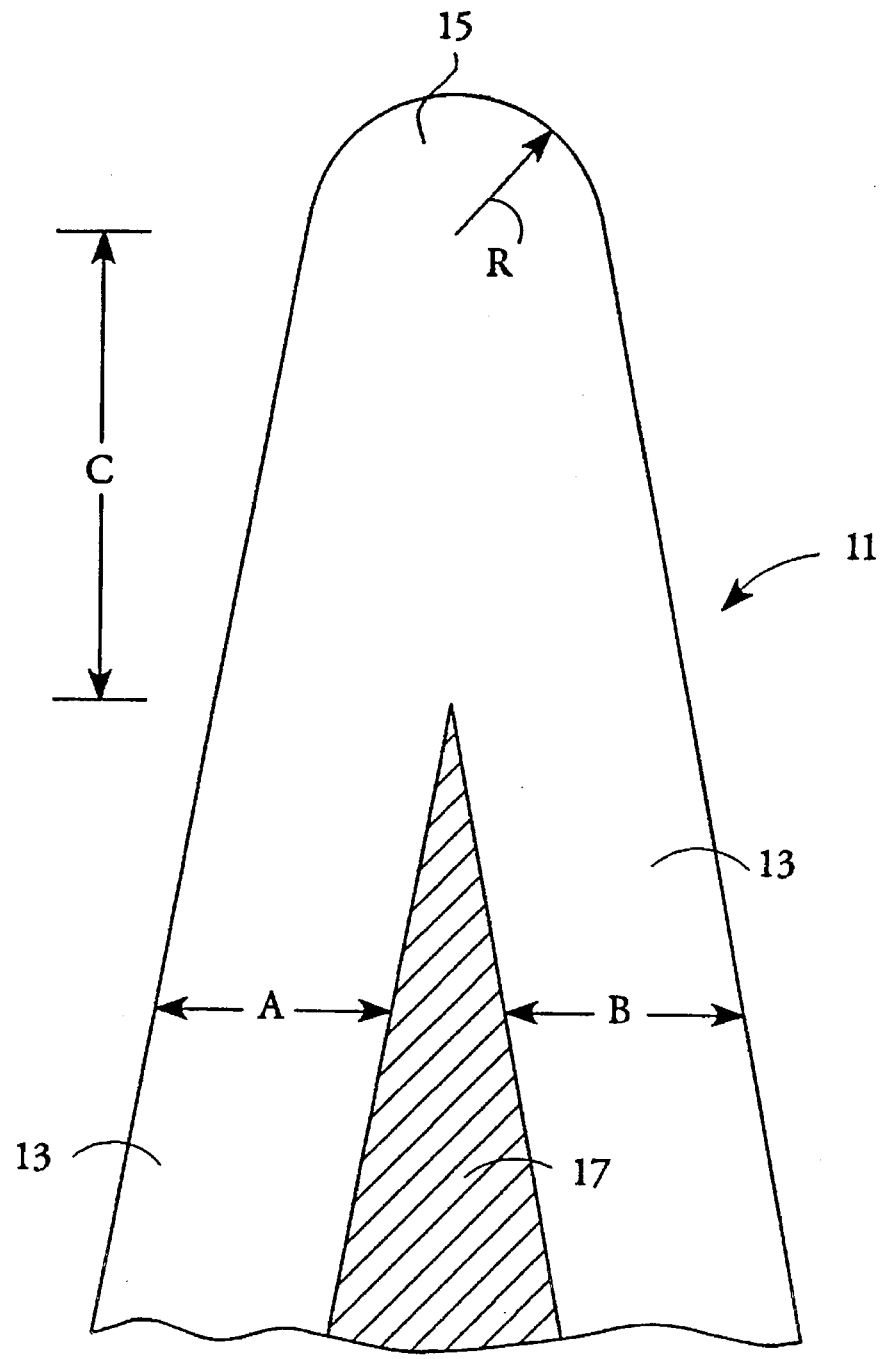
FIG. 3 is a plan view of a micro-probe tip in accord with the present invention.

Even if the conversion of SiC extends only 200 Å deep, then the top 500 Å to 1000 Å of the tip will virtually be completely converted to the coating material. In FIG. 3, outer zones 13 of tip 11 are reacted to form SiC. The dimensions A and B are 200 Å each. A rounded tip may form at apex region 15 having an estimated radius of about 100 Å indicated by arrow R, but conditions for forming rounded tips are not understood and rounding cannot be predicted. The rounding of the tip would give the tip a stylus quality, avoiding tendency to fracture if the tip tapered to a hair-like point, as well as reducing the tendency to stick to material. An unreacted silicon zone 17 lies beneath the reacted regions. In this manner, the working end of the tip which comes in contact with the sample is completely converted, even though the inner shaft has not reacted. The length of the completely converted portion, indicated by arrow C, is about 500 Å. Very short reaction times of a few minutes are all that is required to provide almost complete conversion.

The above procedures can be readily executed in commercially available rapid thermal anneal stations (RTA), rapid thermal oxidation or nitridation systems, or other CVD reactors by using the appropriate ambient. To remove any native oxides, an application of a 10:1 solution of DI water and hydrofluoric acid may be used, or the oxides may be removed by heating in hydrogen gas at 700° C. to 950° C. at a pressure in the range of a fraction of a milli-Torr to a few milli-Torr, e.g. from $10^{-5}$ to $10^{-2}$ Torr. Alternatively, a solution of ammonium fluoride or vaporous hydrogen fluoride may be used.

Figure 4:
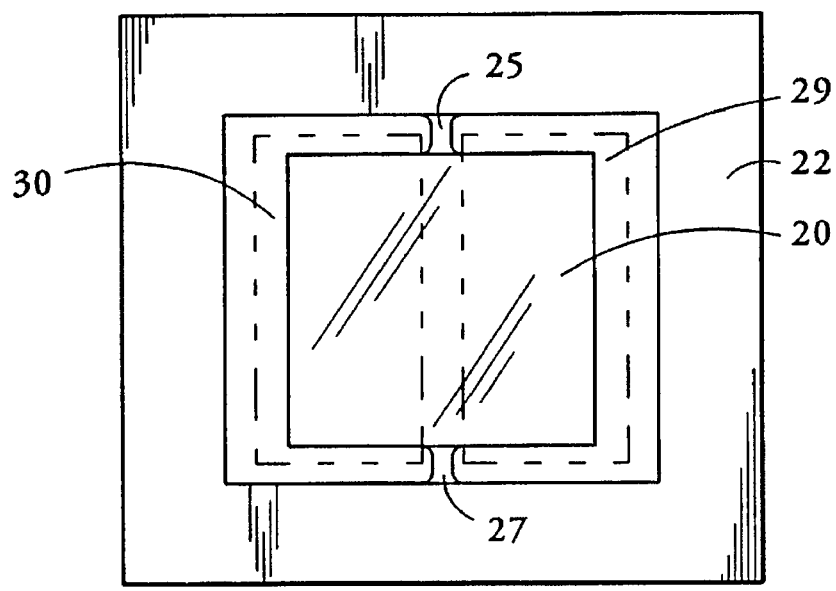
FIG. 4 is a top view of a micromachined pivoting mirror having hinges which have been reacted in accord with the present invention.

Other MEMS can be formed with the surface layer conversion method of the present invention. Referring now to FIG. 4, a movable micromechanical mirror 20 is shown within a section 22 of a silicon wafer. A wafer has been etched to define torsional support bars or hinges 25 and 27 connecting the mirror 20 to the section 22. Mounted below the wafer and spaced slightly from the mirror 20 are electrodes 29 and 30. These electrodes will be alternately charged by voltages which cause electric fields to attract one side or another of the mirror 20, causing the mirror to pivot and thereby changing the direction at which light is reflected. The hinges 25 and 27 are thus frequently twisted in operation, causing stresses and strains that can damage the hinges and lead to failure of the mirror 20.

In order to strengthen the hinges 25 and 27, they are reacted using the process of the present invention in an organic gas at an elevated temperature, so that carbon atoms diffuse into a surface layer of the hinges and form a tough skin of silicon carbide. During this reaction, the mirror 20 has been masked with an oxide or nitride coating to keep the mirror surface free from carbide formation. After the silicon carbide reaction has taken place, the temperature is lowered, and the oxide or nitride is stripped from the mirror 20 to leave a flat, reflective surface of silicon. The gas reaction process of the present invention allows a tough silicon carbide surface layer to be formed in a gentle manner surrounding the hinges 25 and 27, including areas that would be difficult to reach without causing damage using other methods. The stripping or unmasking of the oxide or nitride coating is well known in the art.

Figure 5:
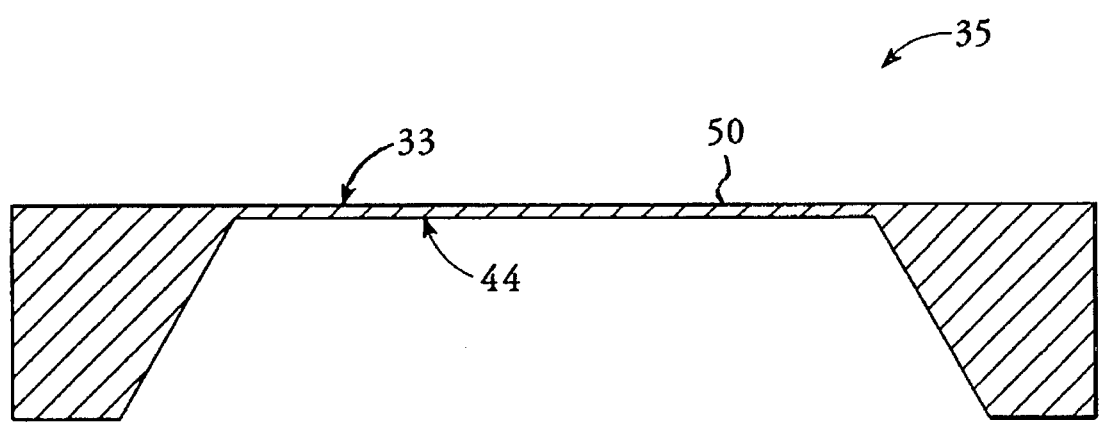
FIG. 5 is a cross-sectional view of a membrane which has been reacted in accord with the present invention.

FIG. 5 shows a thin membrane 50 from 500 Å to 50 microns thick formed from a solid silicon or polysilicon substrate 35. Membrane 50 may be used as a window or as part of a pressure transducer or microphone. Membrane 50 may be made with a variety of fabrication techniques known in the art such as anisotropic etching, using Simox or bonded wafers, electrochemical etch stops, or boron doping. Such membranes may be under very high stress, especially when used as atmospheric windows to hold off pressure against a vacuum. They may also need some protection from reactive ingredients in the atmosphere.

By immersion of membrane 50 in a gaseous hydrocarbon atmosphere ranging from $10^{-7}$ to $5 \times 10^{-2}$ Torr and 700° to 1100° C., it is possible to form very thin layers of silicon carbide on both sides 33 and 44 of membrane 50, after membrane 50 is formed. If only one sided deposition on the membrane is desired, the same technique can be used before membrane formation, e.g. by reacting side 33 of substrate 35 and then forming membrane 50. The temperature range for deposition may be slightly higher than for structures such as tips, because there is no danger of losing the sharp points which are desired in carbide tip formation.

Such procedures may also be used for deformable optical grating modulators, actuators, relays, cantilevers, gears, motors, gimbals, etc., which may be made out of silicon or polysilicon. Surface wear is also reduced by the formation of very hard surface layers. The methods of the present invention greatly help in eliminating stiction that may take place in these devices where moisture tends to collect. Silicon carbide is relatively hydrophobic as compared to silicon and polysilicon.

Another example of a hard finish involves $Si_3N_4$. For silicon nitride, an appropriate source of nitrogen such as ammonia needs to be used. Because of its relative stability, nitrogen gas, although usable, is less desirable as it does not decompose readily. The superhard finish can also be prepared by plasma anodic nitridation in a nitrogen-hydrogen plasma at lower temperatures (700°–900° C.), or in an ammonia plasma. In plasma nitridation, the silicon or polysilicon tip is placed in a vacuum chamber in the vicinity of a pair of electrodes. A nitrogen-containing gas, such as ammonia, $NH_3$ is introduced into the chamber. A gas ionizing, AC voltage is applied to the electrodes, activating the ionized gas and accelerating ions through the chamber, some of which will encounter the tip and react with the silicon or polysilicon to form a hard and tough $Si_3N_4$ layer having a thickness of at least 100 Å. Thermal nitridation is a well established technology in the semiconductor industry. It provides for very good quality, but usually very thin (50–100 Å) films, as the growth kinetics are self-limiting. For selective positioning of a silicon nitride finish, masking with an oxide coating is appropriate.

Structures coated with $Si_3N_4$ are usually non-conducting, as the nitride tends to be a very good insulator under normal conditions. However, its inertness offsets this particular difficulty. Mixtures of oxi-nitrides or carbo-nitrides, prepared with gases which supply oxygen, carbon and nitrogen, are used to vary conductivity, depending on the application for the structures.

Other silicon or polysilicon microstructures can similarly be reacted by the methods of the present invention. These methods are most useful for microstructures in which sharp edges, corners or tips are preferable, and strength is also desired. Silicon carbide is formed in a surface layer of those microstructures for which a conductive surface layer is preferable, while silicon nitride is formed in that layer when electric insulation is paramount. In some structures, both silicon carbide and silicon nitride surface layers in separate areas may desired. These can be formed, for example, by first forming silicon nitride surface layers in selected areas, and then forming silicon carbide in other areas, using oxide and nitride coatings as masks.

I claim:

1. A method of making superhard mechanical microstructures ("MEMS") comprising steps of:
   providing a solid substrate made of a material selected from a group consisting of silicon and polysilicon;
   micromachining the solid substrate to create MEMS having features; and
   reacting at least a portion of the MEMS at an elevated temperature with a gas having molecules that includes atoms selected from a group consisting of nitrogen and carbon, such that the atoms diffuse into a surface layer of the MEMS, thereby forming in the surface layer of the MEMS a compound that includes silicon and the diffused atoms, the temperature being selected such that the features formed on the MEMS during micromachining are preserved essentially unchanged in shape.

2. The method of claim 1 wherein the formed compound is silicon carbide.

3. The method of claim 1 wherein the formed compound is silicon nitride.

4. The method of claim 1 wherein the elevated temperature is in the range of 700° C. to 1100° C.

5. The method of claim 1 wherein the step of reacting at least a portion of the MEMS comprises:
   reacting at a gas pressure in the range of $10^{-7}$ Torr to $5 \times 10^{-2}$ Torr.

6. The method of claim 1 wherein the step of reacting at least a portion of the MEMS comprises:
   using hydrocarbon gas as the gas having molecules including carbon atoms.

7. The method of claim 6 wherein the step of reacting at least a portion of the MEMS further comprises:
   selecting the gaseous hydrocarbon selected from a group consisting of methane, ethane, propane, and acetylene.

8. The method of claim 6 further comprising steps of:
   prior to the step of reacting at least a portion of the MEMS, masking with a coating of silicon nitride a portion of the MEMS that is not to be reacted, and
   stripping the coating after the step of reacting at least a portion of the MEMS.

9. The method of claim 1 wherein the step of reacting at least a portion of the MEMS comprises:
   using ammonia gas as the gas having molecules including nitrogen atoms.

10. The method of claim 1 further comprising a step of removing oxides from the surface layer of the MEMS prior to the step of reacting at least a portion of the MEMS.

11. The method of claim 10 wherein the step of removing oxides includes applying to the MEMS a solution selected from a group consisting of hydrofluoric acid and ammonium fluoride.

12. The method of claim 10 wherein the step of removing oxides includes exposing the MEMS to hydrogen gas at a temperature in the range of 700° C. to 950° C. and a pressure in the range of $10^{-5}$ Torr to $5 \times 10^{-2}$ Torr.

13. The method of claim 1 further comprising steps of:
   prior to the step of reacting at least a portion of the MEMS, masking with a coating of silicon oxide a portion of the MEMS that is not to be reacted, and
   stripping the coating after the step of reacting at least a portion of the MEMS.

14. The method of claim 1 wherein forming the compound in the surface layer includes substantially surrounding the MEMS with the compound.

15. The method of claim 1 wherein the step of micromachining the substrate to create the MEMS having features includes forming a hinge.

16. The method of claim 1 wherein the step of micromachining the substrate to create the MEMS having features includes forming a membrane.

17. The method of claim 1 wherein the step of micromachining the substrate to create the MEMS having features includes forming an actuator.

18. The method of claim 1 wherein the step of micromachining the substrate to create the MEMS having features includes forming a sensor.

* * * * *